United States Patent
Cheng et al.

(10) Patent No.: US 6,759,329 B2
(45) Date of Patent: Jul. 6, 2004

(54) INTERNAL CIRCUIT STRUCTURE OF SEMICONDUCTOR CHIP WITH ARRAY-TYPE BONDING PADS AND METHOD OF FABRICATING THE SAME

(75) Inventors: Wen-Lung Cheng, Taipei Hsien (TW); Hung-Cheng Huang, Taipei-Hsien (TW); I-Feng Chang, Taipei Hsien (TW)

(73) Assignee: Ali Corporation, Taipei Hsien (TW)

( * ) Notice: Subject to any disclaimer, the term of this patent is extended or adjusted under 35 U.S.C. 154(b) by 0 days.

(21) Appl. No.: 10/434,788

(22) Filed: May 8, 2003

(65) Prior Publication Data

US 2004/0004296 A1 Jan. 8, 2004

Related U.S. Application Data

(60) Continuation of application No. 10/313,100, filed on Dec. 5, 2002, now abandoned, which is a division of application No. 10/142,476, filed on May 10, 2002, now abandoned.

(30) Foreign Application Priority Data

Dec. 13, 2001  (TW) ...................................... 90130915 A

(51) Int. Cl.[7] ......................... H01L 23/48; H01L 23/52; H01L 23/495; H01L 29/40; H01L 21/44; H01L 21/4763

(52) U.S. Cl. ...................... 438/666; 438/612; 438/622; 257/786; 257/758; 257/676

(58) Field of Search ............................... 257/786, 690, 257/691, 692, 676, 774, 773, 758; 438/618, 629, 612, 617, 622, 666

(56) References Cited

U.S. PATENT DOCUMENTS

| | | | | |
|---|---|---|---|---|
| 5,784,242 A | | 7/1998 | Watt ........................... | 361/111 |
| 5,801,440 A | * | 9/1998 | Chu et al. .................... | 257/691 |
| 5,900,675 A | | 5/1999 | Appelt et al. ................ | 257/778 |
| 5,917,220 A | | 6/1999 | Waggoner ................... | 257/360 |
| 6,008,532 A | * | 12/1999 | Carichner .................... | 257/691 |
| 6,291,898 B1 | * | 9/2001 | Yeh et al. ................... | 257/786 |
| 6,307,271 B1 | * | 10/2001 | Nakamura ................... | 257/786 |
| 6,410,990 B2 | * | 6/2002 | Taylor et al. ............... | 257/786 |
| 6,680,544 B2 | * | 1/2004 | Lu et al. ..................... | 257/786 |

OTHER PUBLICATIONS

U.S. patent application Ser. No. 10/434,787, Chen et al. filed May 8, 2003.

* cited by examiner

*Primary Examiner*—Nathan J. Flynn
*Assistant Examiner*—Victor A. Mandala, Jr.
(74) *Attorney, Agent, or Firm*—Ladas & Parry

(57) ABSTRACT

An internal circuit structure of a semiconductor chip with array-type bonding pads. The semiconductor chip has a plurality of bonding pads located about periphery of the semiconductor chip, a plurality of signal circuit macros being positioned inside the bonding pads of the semiconductor chip, and an electro-static discharge clamping circuit ring between the signal circuit macros and the inner row of the bonding pads. The bonding pads are positioned in at least four rows along each side of the semiconductor chip, in which the four rows has an inner row, a mid-inner row, a mid-outer row, and an outer row. The inner row and the mid-inner row of the bonding pads consist of signal pads, and the outer row and the mid-outer row of the bonding pads consist of power pads and ground pads. Each of the signal circuit macros is positioned to align to the corresponding bonding pads.

6 Claims, 8 Drawing Sheets

INTERNAL CIRCUIT STRUCTURE OF SEMICONDUCTOR CHIP WITH ARRAY-TYPE BONDING PADS AND METHOD OF FABRICATING THE SAME

This application is a continuation of U.S. application Ser. No. 10/313,100, filed Dec. 5, 2002, now abandoned which is a divisional of U.S. application Ser. No. 10/142,476, filed May 10, 2002, now abandoned which claims the benefit of Taiwanese Patent Application No. 90130915 "INTERNAL CIRCUIT STRUCTURE OF SEMICONDUCTOR CHIP WITH ARRAY-TYPE BONDING PADS AND METHOD OF FABRICATING THE SAME."

BACKGROUND OF THE INVENTION

1. Field of the Invention

The present invention relates to an internal circuit structure of a semiconductor chip and a method of fabricating the internal circuit structure, and more particularly to an internal circuit structure of a wire-bonding package of a semiconductor chip with bonding pads arranged in an array, such as a ball grid array structure or flip chip structure.

2. Description of the Related Art

As semiconductor technique rapidly improves, the operational speed and the complexity of the semiconductor chips have increased. Accordingly, research in packaging technology comes hereafter for the requirement of higher packaging efficiency. In a wire-bonding package of a semiconductor chip, arrangement of bonding pads on the semiconductor chip is particularly emphasized. Conductive traces on the substrate of the package, such as a ball-grid array (BGA) package, can be lithographically defined to achieve a very fine pitch.

IC bonding pad designs include single in-line bonding pad design, staggered bonding pad design, and array-type bonding pad design. It is desired to increase the maximum allowable pad number that can be designed on a chip with functional consideration, so single in-line bonding pad design is not preferred. Alternatively, the staggered bonding pad design and the array-type bonding pad design relatively increase the maximum allowable pad number and has been used widely in general.

FIG. 1a and FIG. 1b show a staggered BGA package 100. The package 100 has a chip 110 with a staggered bonding pad design (that is, two-tier type arrangement) disposed on the upper surface of a substrate as shown in FIG. 1a, and the surface of the chip 110 is provided with a plurality of the bonding pads 120 positioned in an outer row 121 and an inner row 122, as shown in FIG. 1b. Further, the upper surface of the substrate is provided with a ground ring 130, a power ring 140, and a plurality of conductive traces 160. The bonding pads 120 on the chip 110 include power pads for supplying the source voltage, ground pads for supplying the ground potential, and signal pads (I/O pads), which are respectively connected to the ground ring 130, the power ring 140 and the conductive traces 160 by bonding wires 121a, 121b, 122a and 122b.

Further, the package of a semiconductor chip with array-type bonding pads is disclosed in Taiwan patent application No. 90125929 "PACKAGE OF SEMICONDUCTOR CHIP WITH ARRAY-TYPE BONDING PADS". FIG. 2a and FIG. 2b show a package 1 of the semiconductor chip with array-type bonding pads. The package 1 has a semiconductor chip 10, in which bonding pads 20 are positioned in at least four rows (four rows exactly in FIG. 2a and FIG. 2b) along each side of the chip 10. The four rows of the bonding pads 20 have an inner row 24, a mid-inner row 23, a mid-outer row 22, and an outer row 21, as shown in FIG. 2b. Further, the inner row 24 and the mid-inner row 23 of the bonding pads 20 serve as signal pads only, and the outer row 21 and the mid-outer row 22 of the bonding pads 20 serve as power pads and ground pads only. The inner row 24 and the mid-inner row 23 of the bonding pads 20 (that is, the signal pads) are disposed in an arrangement similar to the staggered bonding pad design; that is, the inner row 24 and the mid-inner row 23 of the bonding pads 20 are positioned in an interlaced arrangement in relation to an edge of the chip 10. Meanwhile, the mid-outer row 22 of the bonding pads 20 are positioned to align to the inner row 24 of the bonding pads 20 in a perpendicular direction to the edge of the chip 10, and the outer row 21 of the bonding pads 20 are positioned to align to the mid-inner row 23 of the bonding pads 20 in a perpendicular direction to the edge of the chip 10. The bonding pads 20 are connected to the corresponding ground ring 30, power ring 40 and conductive traces 60 by the first, second, third and fourth bonding wires 21a, 22a, 23a and 24a with different loop height.

The package of the semiconductor chip with array-type bonding pads has a larger maximum allowable pad number that can be designed on the chip than the staggered BGA package. That is, with the array-type bonding pad design, the chip size can be reduced with the same number of bonding pads provided on the chip, so as to reduce cost and increase package quality of the chip.

However, with the array-type bonding pad design, the internal circuit of the chip is limited in a more restricted area, which leads to problem in the internal circuit arrangement.

FIG. 3 shows an example of the internal circuit structure of the staggered chip 110. In FIG. 3, the outer row 121 of the bonding pads 120 are power pads or ground pads, which are electrically connected to the power/ground circuit macros 180 by first signal lines, in which the first signal lines are formed with power/ground buses 128. Meanwhile, the inner row 122 of the bonding pads 120 are signal pads (I/O pads), which are electrically connected to the signal circuit macros 170 by second signal lines, in which the second signal lines are formed with signal buses 126. Each of the signal circuit macros 170 and the power/ground circuit macros 180 are positioned to align the corresponding bonding pads 120 and adjacent to each other, in which a circuit macro has a width W substantially equal to the bonding pad pitch P.

In the staggered semiconductor chip, each of the signal circuit macros 170 and the power/ground circuit macros 180 are positioned to align the corresponding bonding pads 120 and adjacent to each other. However, in the semiconductor chip with array-type bonding pads, the mid-outer row 22 of the bonding pads 20 are positioned to align to the inner row 24 of the bonding pads 20 in a perpendicular direction to the edge of the chip 10, and the outer row 21 of the bonding pads 20 are positioned to align to the mid-inner row 23 of the bonding pads 20 in a perpendicular direction to the edge of the chip 10. Thus, if the internal circuit of the semiconductor chip with array-type bonding pads is arranged as the aforementioned internal circuit arrangement of the staggered semiconductor chip, the circuit macros may interfere each other, so that the internal circuit structure can not function regularly.

SUMMARY OF THE INVENTION

In view of this, the present invention relates to a internal circuit structure of a semiconductor chip with array-type bonding pads, which provides a corresponding internal circuit structure while increasing the maximum allowable pad number that can be designed on the chip. That is, the present invention discloses an internal circuit structure for the semiconductor chip with array-type bonding pads, so that the semiconductor chip with array-type bonding pads can be practically achieved. Thus, the chip size can be reduced with the same number of bonding pads provided on the chip, so as to reduce cost and increase package quality of the chip.

The present invention discloses a semiconductor chip, which has a plurality of bonding pads located about periphery of the semiconductor chip, a plurality of signal circuit macros being positioned inside the bonding pads of the semiconductor chip, and an electro-static discharge clamping circuit ring being positioned between the signal circuit macros and the inner row of the bonding pads. The bonding pads are positioned in at least four rows along each side of the semiconductor chip, in which the four rows has an inner row, a mid-inner row, a mid-outer row, and an outer row. The inner row and the mid-inner row of the bonding pads consist of signal pads, and the outer row and the mid-outer row of the bonding pads consist of power pads and ground pads. Further, each of the signal circuit macros is positioned to align to the corresponding bonding pads.

Further, the present invention discloses a method of fabricating a semiconductor chip, comprising the steps of: providing a substrate with a plurality of signal circuit macros and a electro-static discharge clamping circuit ring formed with power/ground circuit, wherein the signal circuit macros and the electro-static discharge clamping circuit ring are insulated to each other; forming a plurality of conductive layers sequentially above part of the substrate, wherein insulating layers are formed between the conductive layers; forming a plurality of bonding pads on part of the conductive layers, wherein the bonding pads are positioned in at least four rows, the four rows comprising an inner row, a mid-inner row, a mid-outer row, and an outer row; and forming a plurality of vias in the insulating layers, wherein the outer row and the mid-outer row of the bonding pads is connected to a predetermined portion of the conductive layers above the signal circuit macros by the conductive layers and the electro-static discharge clamping circuit ring to form a first signal line, the inner row and the mid-inner row of the bonding pads is connected to the signal circuit macros by the conductive layers to form a second signal line, and the first signal line and the second signal line are insulated to each other.

In the present invention, it is preferable that the inner row and the mid-inner row of the bonding pads are positioned in an interlaced arrangement in relation to an edge of the chip, the mid-outer row of the bonding pads are positioned to align to the inner row of the bonding pads in a perpendicular direction to the edge of the chip, and the outer row of the bonding pads are positioned to align to the mid-inner row of the bonding pads in a perpendicular direction to the edge of the chip. Further, each of the signal circuit macros preferably has a width substantially equal to a bonding pad pitch. Further, a power/ground circuit ring can be provided above the signal circuits to supply power to the signal circuit macros.

The semiconductor chip of the present invention is suited to a flip chip structure or a ball grid array (BGA) package.

BRIEF DESCRIPTION OF THE DRAWINGS

The present invention can be more fully understood by reading the subsequent detailed description in conjunction with the examples and references made to the accompanying drawings, wherein:

FIG. 5b is a side view of the internal circuit structure of the semiconductor chip shown in FIG. 5a.

DETAILED DESCRIPTION OF THE PREFERRED EMBODIMENT

Figure 1A:
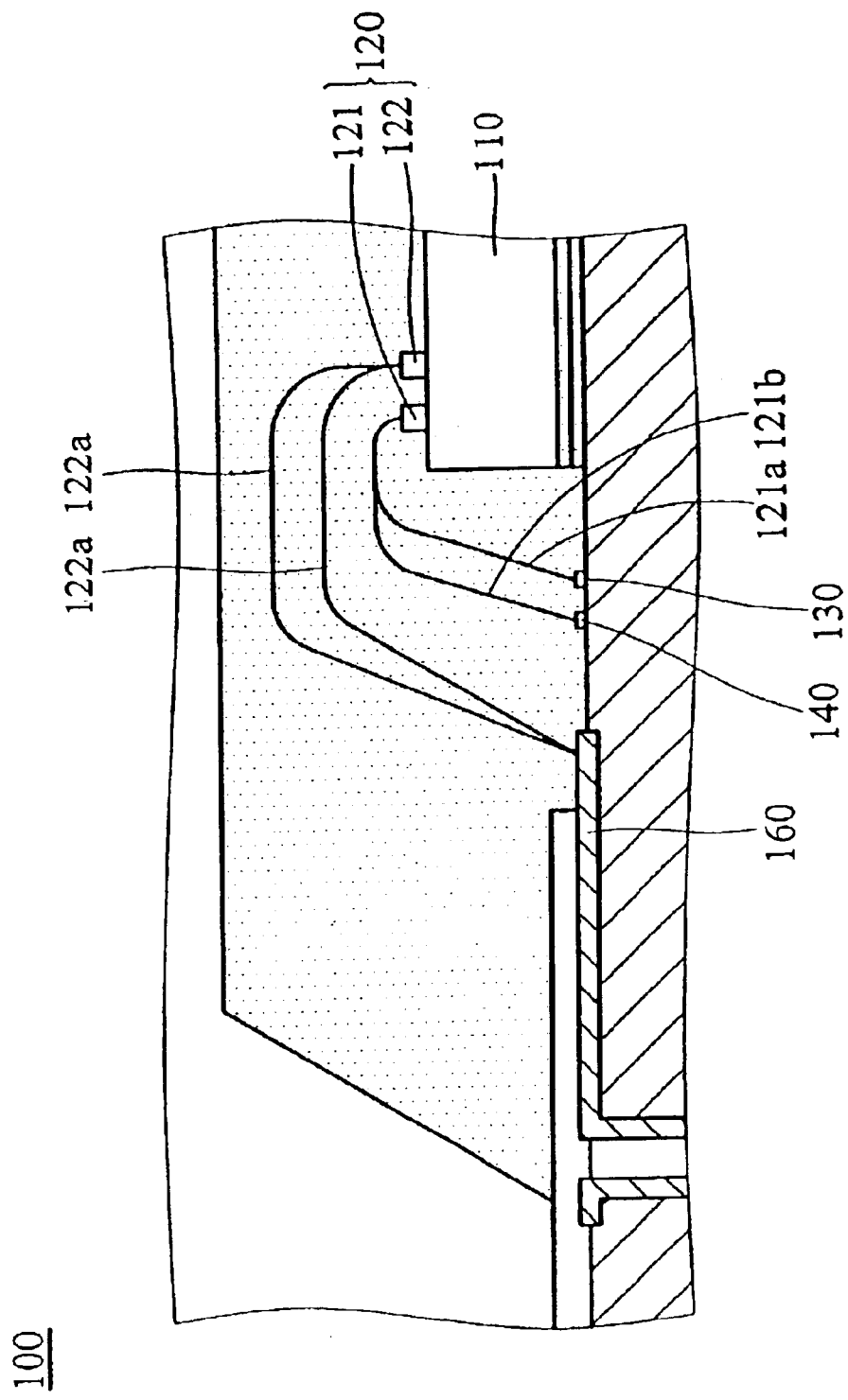
FIG. 1a is a cross sectional view of the BGA package with the staggered bonding pad.
Figure 1B:
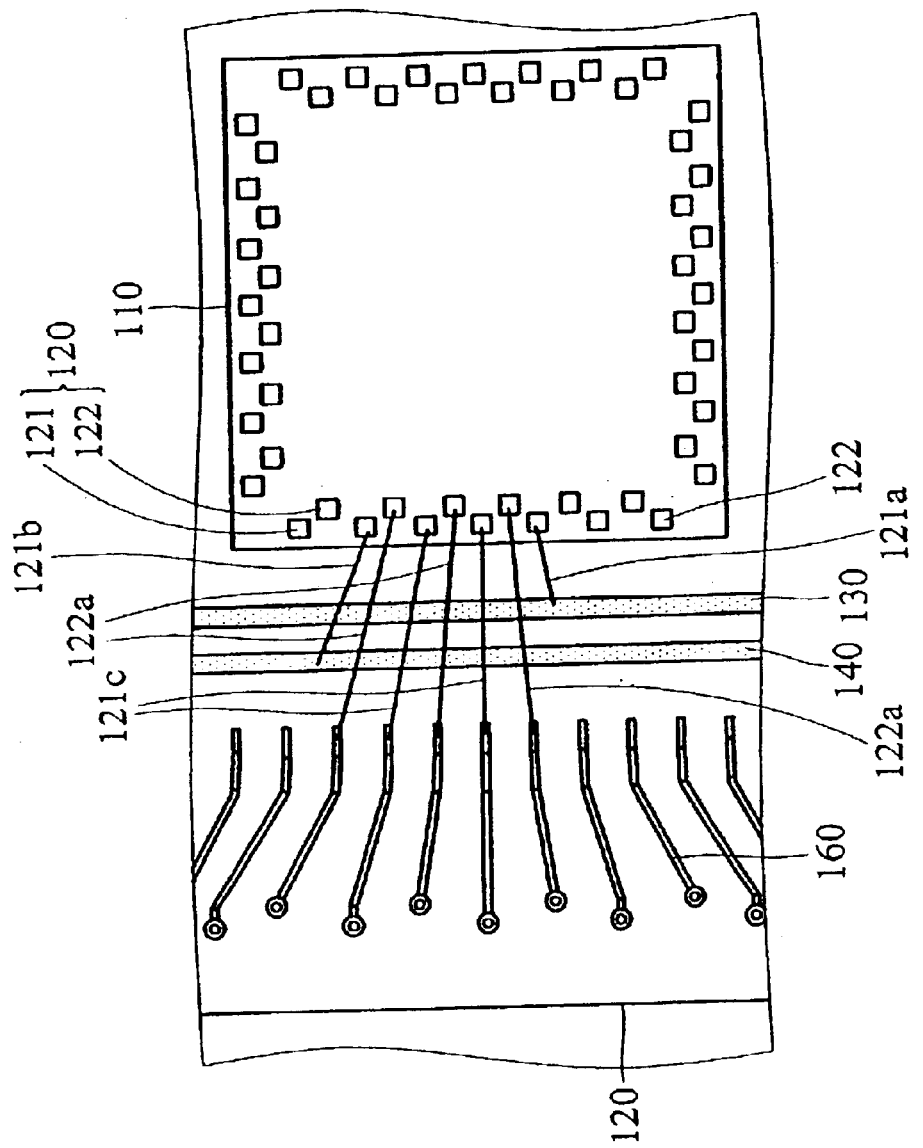
FIG. 1b is a top view of the package shown in FIG. 1a, wherein the package body has been removed.
Figure 2A:
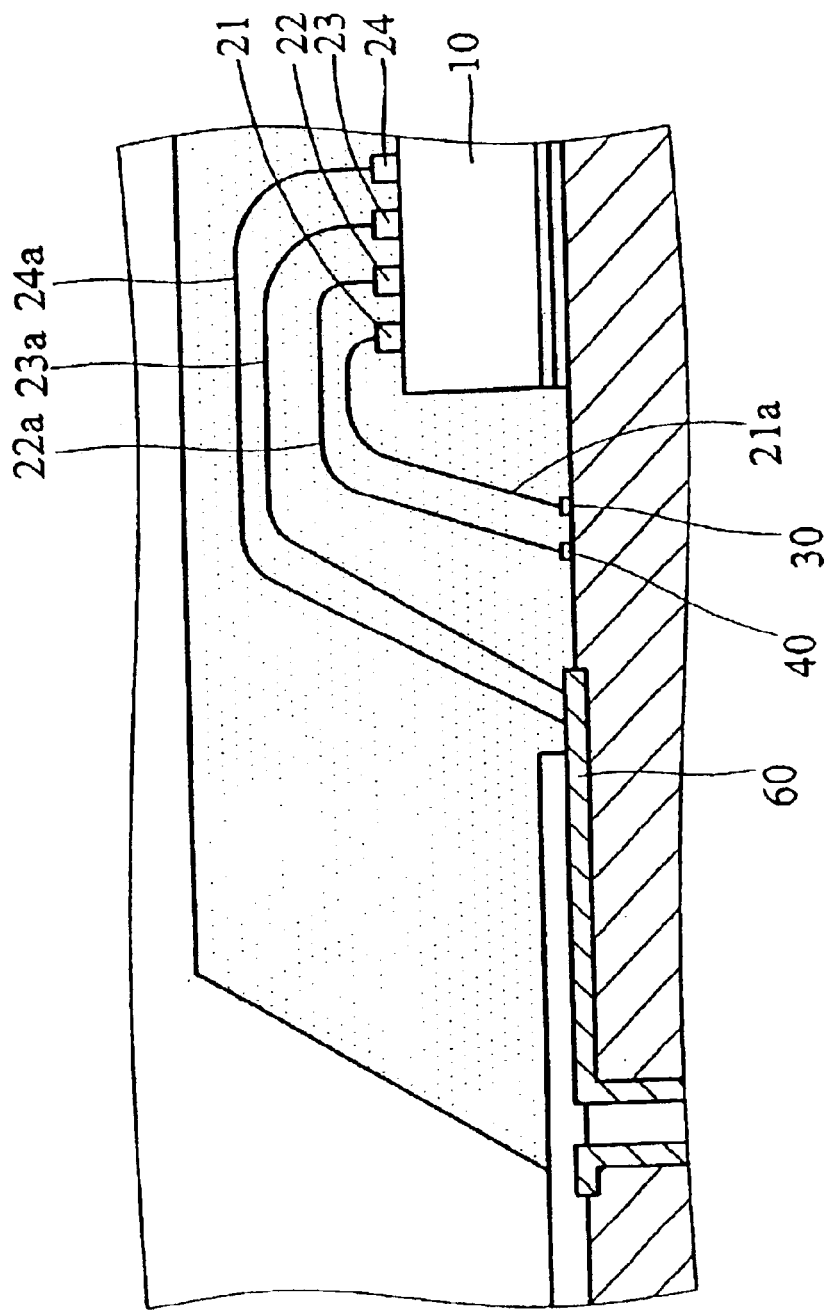
FIG. 2a is a cross-sectional view showing the package of a semiconductor chip with array-type bonding pads.
Figure 2B:
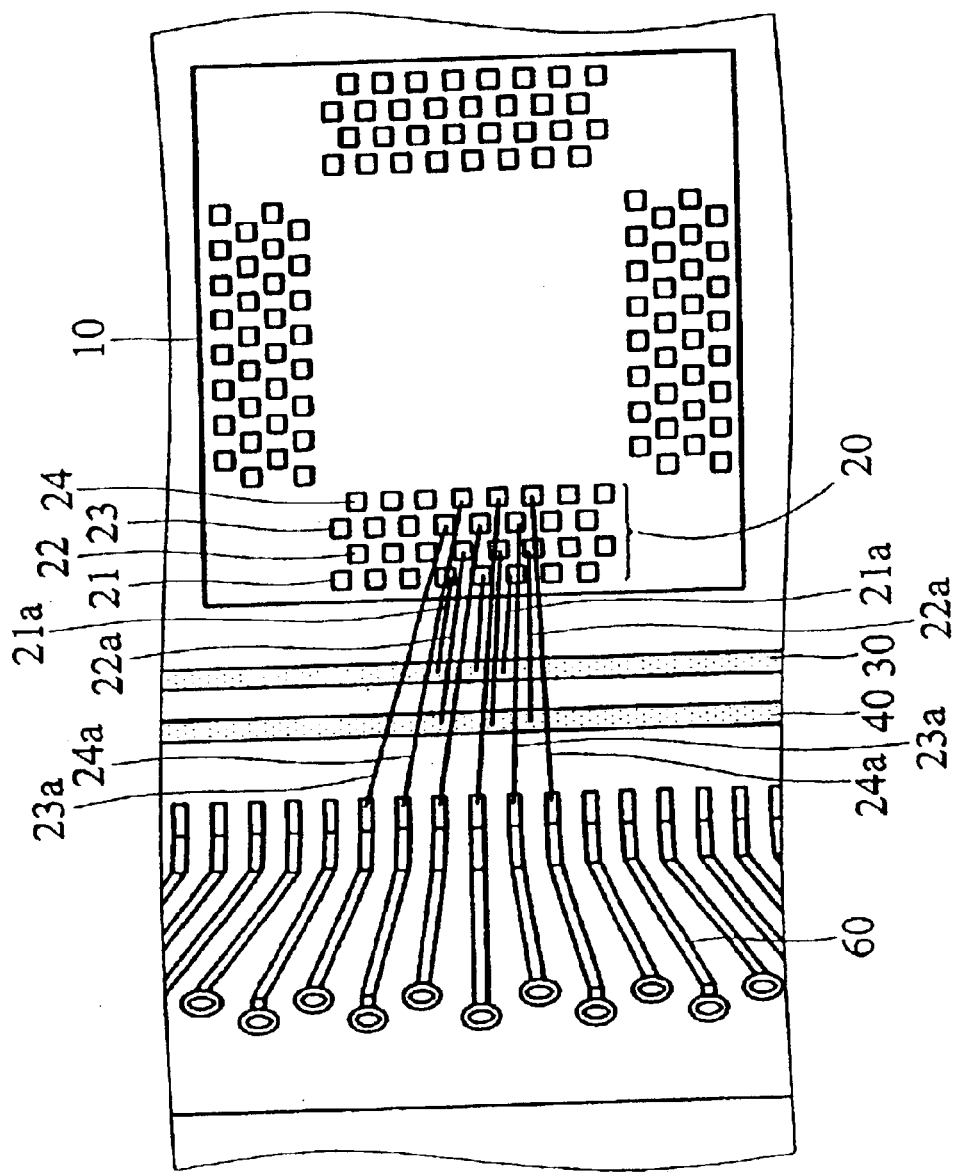
FIG. 2b is a top view of the package shown in FIG. 2a, wherein the package body has been removed.
Figure 3:
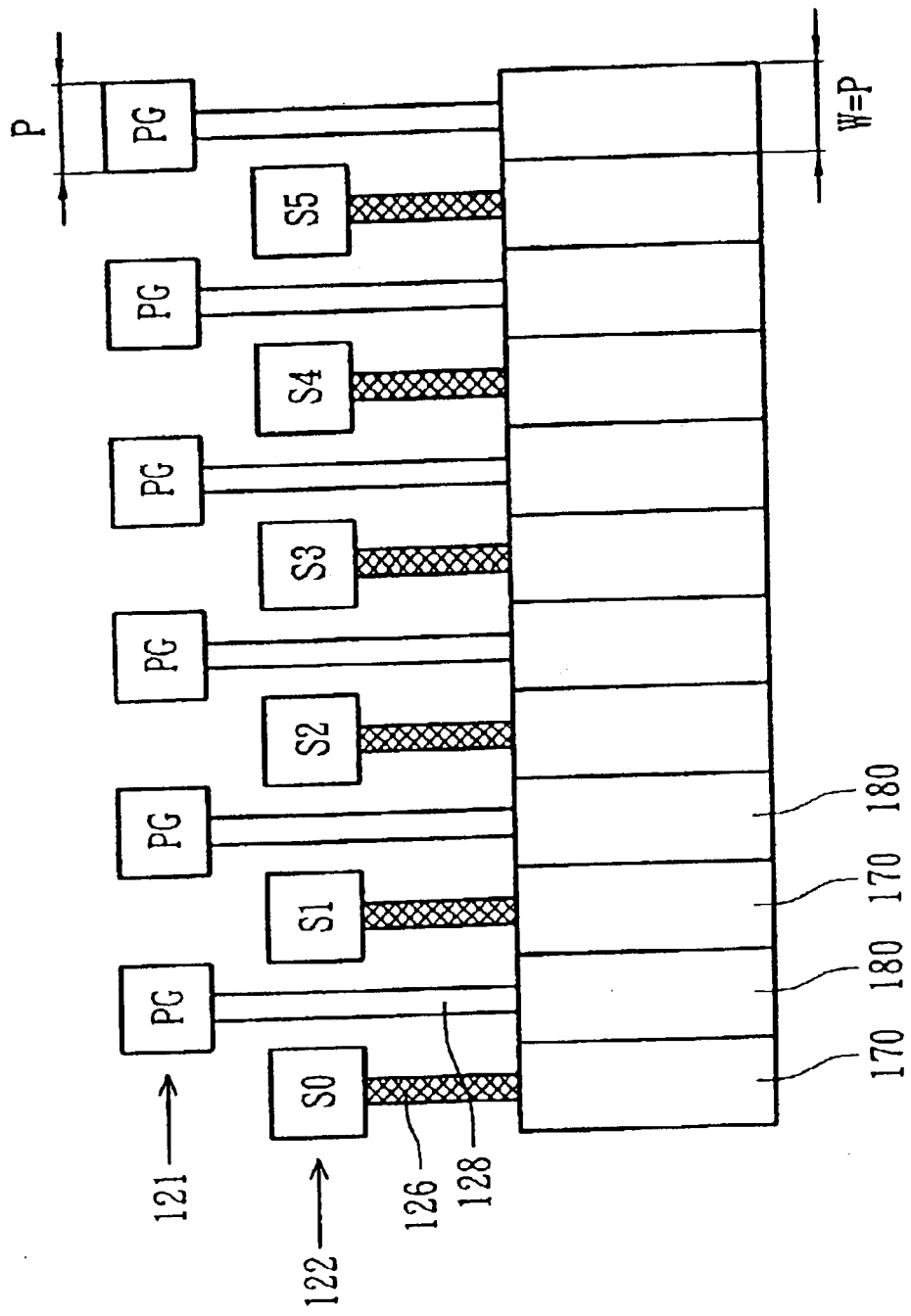
FIG. 3 shows a schematic view of the internal circuit structure of the staggered semiconductor chip.
Figure 4:
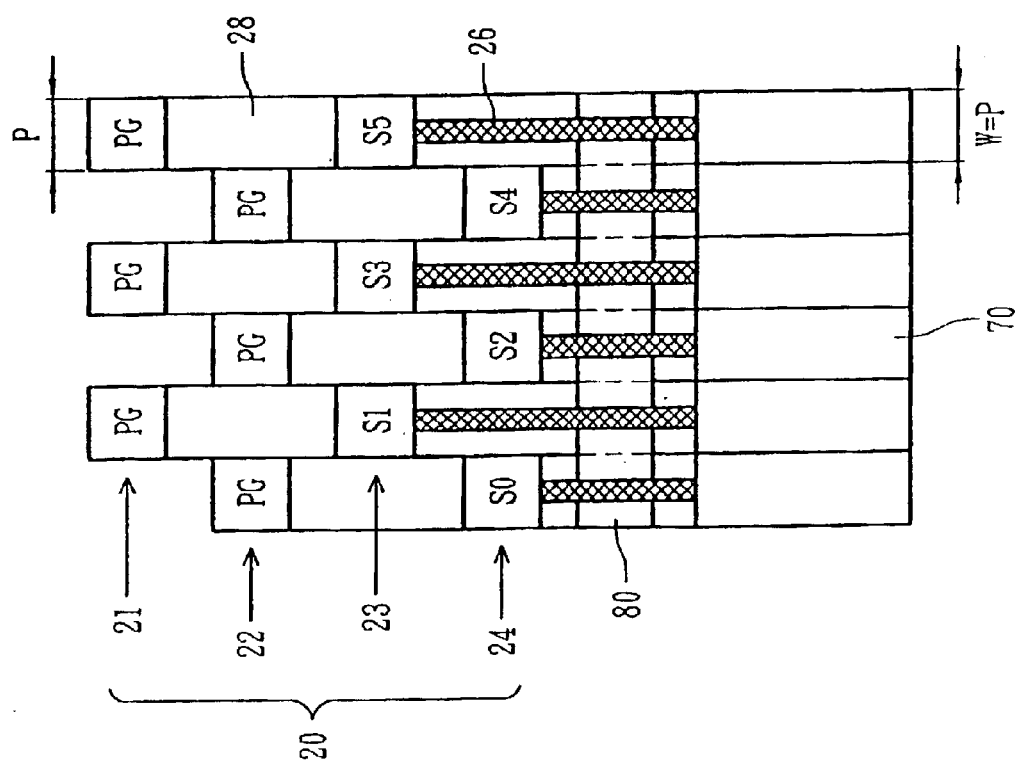
FIG. 4 shows a schematic view of the internal circuit structure of the semiconductor chip of the present invention.

An embodiment of the internal circuit structure of the semiconductor chip 10 of the present invention is hereinafter described with reference to FIG. 4.

In the embodiment, the semiconductor chip 10 is provided with a plurality of bonding pads 20, a plurality of signal circuit macros 70, and an electro-static discharge (ESD) clamping circuit ring 80.

The bonding pads 20 are located about periphery of the semiconductor chip 10 and positioned in at least four rows (four rows exactly in the embodiment) along each side of the semiconductor chip 10, in which the four rows has an inner row 24, a mid-inner row 23, a mid-outer row 22, and an outer row 21. The inner row 24 and the mid-inner row 23 of the bonding pads 20 are positioned in an interlaced arrangement in relation to an edge of the chip 10. The mid-outer row 22 of the bonding pads 20 are positioned to align to the inner row 24 of the bonding pads 20 in a perpendicular direction to the edge of the chip 10, and the outer row 21 of the bonding pads 20 are positioned to align to the mid-inner row 23 of the bonding pads 20 in a perpendicular direction to the edge of the chip 10. Further, the inner row 24 and the mid-inner row 23 of the bonding pads 20 serve as signal pads only, and the outer row 21 and the mid-outer row 22 of the bonding pads 20 serve as power pads and ground pads only.

Further, the signal circuit macros 70 are positioned inside the bonding pads 20 of the semiconductor chip 10, in which each of the signal circuit macros 70 are positioned to align to the corresponding bonding pads 20 and has a width W substantially equal to a bonding pad pitch P. Further, the ESD clamping circuit ring 80 is positioned between the signal circuit macros 70 and the inner row 24 of the bonding pads 20.

Further, the outer row 21 and the mid-outer row 22 of the bonding pads 20 are electrically connected to the ESD clamping circuit ring 80 by first signal lines, in which the first signal lines are formed with power/ground buses 28. Meanwhile, the inner row 24 and the mid-inner row 23 of the bonding pads 20 are electrically connected to the signal circuit macros 70 by second signal lines, in which the second signal lines are formed with signal buses 28.

Further, an embodiment of the internal circuit structure of the semiconductor chip 10 and its fabricating method are hereinafter described in detail with reference to FIG. 5a and FIG. 5b.

Figure 5A:
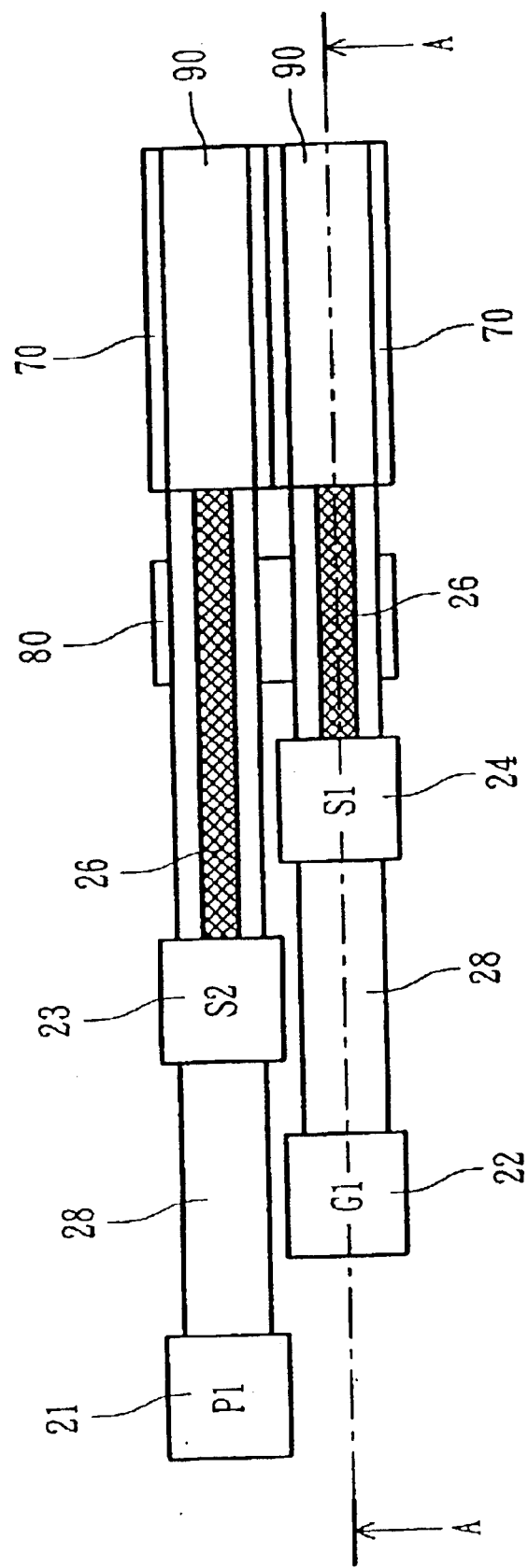
FIG. 5a is a top view showing an embodiment of the internal circuit structure of the semiconductor chip of the present invention.

In FIG. 5a, a group of four rows of the bonding pads 20 and their corresponding internal circuit structure are shown, in which only one bonding pad 20 in a row is shown. In the embodiment, the inner row 24 and the mid-inner row 23 of the bonding pads 20 are signal pads S1 and S2, the mid-outer row 22 of the bonding pads 20 are ground pads G1, and the outer row 21 of the bonding pads 20 are power pads P1. The signal pads S1 and S2 are respectively connected to the signal circuit macros 70 by the signal buses 26, and the ground pad G1 and the power pads P1 are respectively connected to the ESD clamping circuit ring 80 by the power/ground buses 28. The signal buses 26 and the power/ground buses 28 are overlapped in the top view of FIG. 5a, and can be further described in detail with reference to FIG. 5b.

Figure 5B:
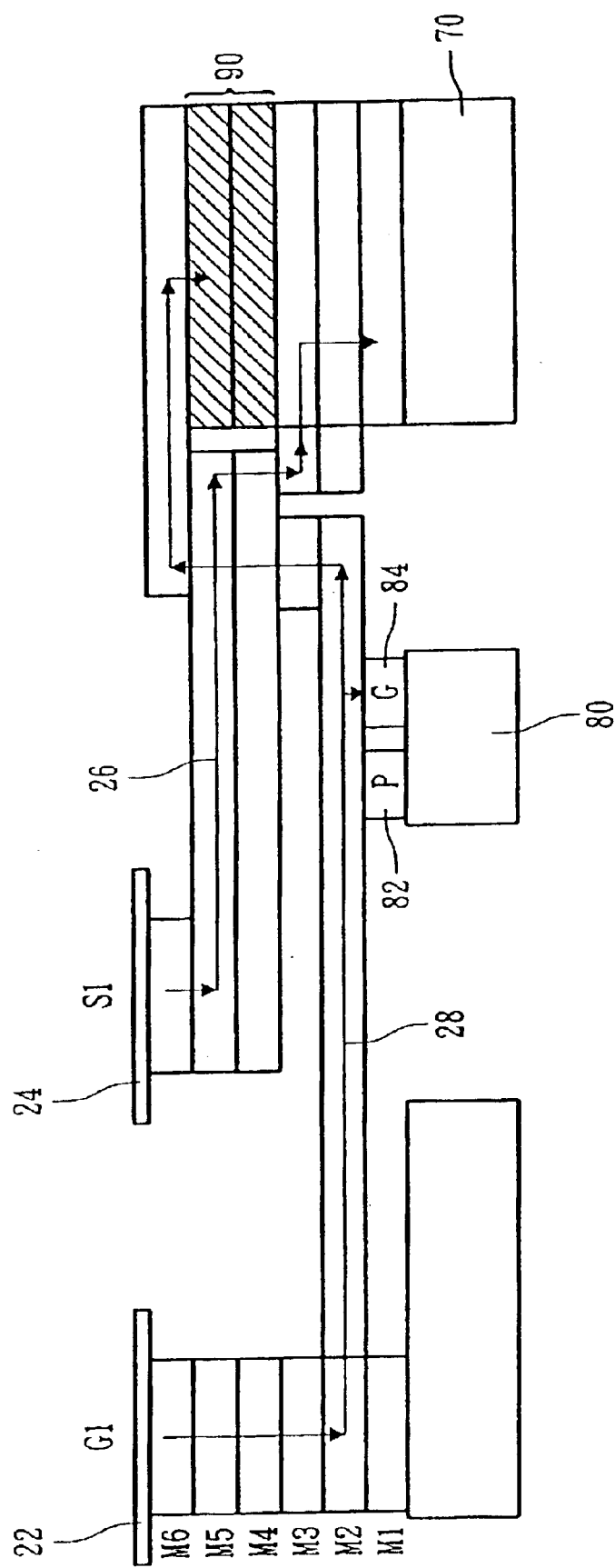

FIG. 5b is a side cross-sectional view of the internal circuit structure of the semiconductor chip along line A—A as shown in FIG. 5a. It should be noted that only the internal circuit structure of a ground pad G1 and a signal pad S1 (that is, the mid-outer row 22 and the inner row 24 of the bonding pads 20) is shown in FIG. 5b. The power pad P1 and the other signal pad P2 has similar structure, and the description is therefore ignored.

The method of fabricating the semiconductor chip in the embodiment is hereinafter described. First, a substrate (not shown) with a plurality of signal circuit macros 70 and a electro-static discharge clamping circuit ring 80 formed with power/ground circuit is provided, in which the signal circuit macros 70 and the electro-static discharge clamping circuit ring 80 are insulated to each other to avoid short circuiting. Then, a plurality of conductive layers M1~M6, as shown in FIG. 5b, are sequentially formed above part of the substrate, in which insulating layers (not shown) are formed between the conductive layers M1~M6, so that the conductive layers can be insulated to each other. The conductive layer M1 forms the power bus 82 and the ground bus 84 for connecting to the ESD clamping circuit ring 80. In FIG. 5b, the bonding pad 22 is a ground pad G1, so that the conductive layer M2 is electrically connected to the portion of the ground circuit 84 and insulated to the portion of the power circuit 82. Further, the conductive layers M4 and M5 form a power/ground circuit ring 90 above the signal circuit macros 70 to supply power to the signal circuit macros 70.

Then, a plurality of bonding pads 20 is formed on part of the conductive layers, wherein the bonding pads are positioned in four rows, as mentioned above. Then, in order to form a first signal line (that is, the power/ground buses 28) that connects the ground pad G1, the ESD clamping circuit ring 80 and the power/ground circuit ring 90 and a second signal line (that is, the signal buses 26) that connects the signal pad S1 and the signal circuit macros 70, a plurality of vias is formed in the insulating layers. Thus, the first signal line connects the ground pad G1, the ESD clamping circuit ring 80 and the power/ground circuit ring 90, the second signal line connects the signal pad S1 and the signal circuit macros 70, and the first signal line and the second signal line are insulated to each other.

It should be noted that the outer row 21 of the bonding pads 20 serve as the power pads P1, and the mid-outer row 22 of the bonding pads 20 serve as the ground pads G1 in the embodiment. However, the outer row 21 and the mid-outer row 22 of the bonding pads 20 can be either power pads or ground pads.

Further, the conductive layers in the embodiment has six layers M1~M6, in which the first line (the power/ground buses 28) is formed by the conductive layer M2, which passes below the second signal line (the signal buses 26) and through the ESD clamping circuit ring 80 and the via to extend upward to the power/ground circuit ring 90. However, the present invention is not limited in the above-mentioned signal line arrangement.

Further, in the embodiment as shown in FIG. 5b, the bonding pad 22 is a ground pad G1, so that the conductive layer M2 is electrically connected to the portion of the ground circuit 84 and insulated to the portion of the power circuit 82. However, if the bonding pad in FIG. 5b is a power pad, the conductive layer M2 should be electrically connected to the portion of the power circuit 82 and insulated to the portion of the ground circuit 84.

The internal circuit structure of the semiconductor chip and its fabricating method of the present invention can be applied in a flip chip structure or a BGA package, or any other package with similar structure.

While the present invention has been described with reference to the preferred embodiments thereof, it is to be understood that the invention is not limited to the described embodiments or constructions. On the contrary, the invention is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of fabricating a semiconductor chip, comprising the steps of:

providing a substrate with a plurality of signal circuit macros and a electro-static discharge clamping circuit ring formed with power/ground circuit, wherein the signal circuit macros and the electro-static discharge clamping circuit ring are insulated to each other;

forming a plurality of conductive layers sequentially above part of the substrate, wherein insulating layers are formed between the conductive layers;

forming a plurality of bonding pads on part of the conductive layers, wherein the bonding pads are positioned in at least four rows, the four rows comprising an inner row, a mid-inner row, a mid-outer row, and an outer row; and forming a plurality of vias in the insulating layers, wherein the outer row and the mid-outer row of the bonding pads is connected to a predetermined portion of the conductive layers above the signal circuit macros by the conductive layers and the electro-static discharge clamping circuit ring to form a first signal line, the inner row and the mid-inner row of the bonding pads is connected to the signal circuit macros by the conductive layers to form a second signal line, and the first signal line and the second signal line are insulated to each other.

2. The method of fabricating a semiconductor chip according to claim 1, wherein:

the mid-outer row of the bonding pads are positioned to align to the inner row of the bonding pads in a perpendicular direction to the edge of the chip; and the outer row of the bonding pads are positioned to align to the mid-inner row of the bonding pads in a perpendicular direction to the edge of the chip.

3. The method of fabricating a semiconductor chip according to claim 1, wherein each of the signal circuit macros has a width substantially equal to a bonding pad pitch.

4. The method of fabricating a semiconductor chip according to claim 1, wherein the predetermined portion of the conductive layers above the signal circuit macros comprises a power/ground circuit ring to supply power to the signal circuit macros.

5. The method of fabricating a semiconductor chip according to claim 1, wherein the semiconductor chip is suited to a flip chip structure.

6. The method of fabricating a semiconductor chip according to claim 1, wherein the semiconductor chip is suited to a ball grid array package.

* * * * *